(12) United States Patent
Berger et al.

(10) Patent No.: US 8,677,929 B2
(45) Date of Patent: Mar. 25, 2014

(54) METHOD AND APPARATUS FOR MASKING SOLAR CELL SUBSTRATES FOR DEPOSITION

(75) Inventors: Alexander J. Berger, Palo Alto, CA (US); Terry Bluck, Santa Clara, CA (US); Vinay Shah, San Mateo, CA (US); Judy Huang, Los Gatos, CA (US); Karthik Janakiraman, San Jose, CA (US); Chau T. Nguyen, San Jose, CA (US); Greg Stumbo, Scotts Valley, CA (US)

(73) Assignee: Intevac, Inc., Santa Clara, CA (US)

( * ) Notice: Subject to any disclaimer, the term of this patent is extended or adjusted under 35 U.S.C. 154(b) by 3 days.

(21) Appl. No.: 13/338,173

(22) Filed: Dec. 27, 2011

(65) Prior Publication Data
US 2012/0171807 A1  Jul. 5, 2012

Related U.S. Application Data

(60) Provisional application No. 61/428,174, filed on Dec. 29, 2010, provisional application No. 61/487,679, filed on May 18, 2011, provisional application No. 61/493,948, filed on Jun. 6, 2011.

(51) Int. Cl.
| | |
|---|---|
| *B05C 3/00* | (2006.01) |
| *B05C 19/02* | (2006.01) |
| *B65G 37/00* | (2006.01) |
| *B65G 47/12* | (2006.01) |
| *H01L 21/00* | (2006.01) |
| *H01L 25/00* | (2006.01) |
| *B05D 1/18* | (2006.01) |

(52) U.S. Cl.
USPC ........... 118/423; 198/367; 198/452; 414/936; 438/48; 438/57; 438/942; 136/243; 136/265; 427/434.5

(58) Field of Classification Search
USPC ...................... 136/243–265; 438/48, 57, 942; 414/217, 937; 198/348, 367, 373, 374, 198/434, 445; 118/404, 423, DIG. 5, DIG. 9
See application file for complete search history.

(56) References Cited

U.S. PATENT DOCUMENTS 3,006,820 A * 10/1961 Berman ......................... 205/139
3,748,246 A *  7/1973 Goell ......................... 204/192.26
(Continued)

FOREIGN PATENT DOCUMENTS

| WO | 88/06803 A1 | 9/1988 |
|---|---|---|
| WO | 2008/047144 A1 | 4/2008 |
| WO | 20121092301 A2 | 7/2012 |

OTHER PUBLICATIONS

Zohar, R., "Solder Mask Printing With an Ink-Jet Based System," OnBoard Technology, Feb. 2009, pp. 8-10.
(Continued)

*Primary Examiner* — Dah-Wei Yuan
*Assistant Examiner* — Karl Kurple
(74) *Attorney, Agent, or Firm* — Nixon Peabody LLP; Joseph Bach, Esq.

(57) ABSTRACT

Disclosed are methods and apparatus for masking of substrates for deposition, and subsequent lifting of the mask with deposited material. Masking materials are utilized that can be used in high temperatures and vacuum environment. The masking material has minimal outgassing once inside a vacuum chamber and withstand the temperatures during deposition process. The mask is inkjeted over the wafers and, after deposition, removed using agitation, such as ultrasonic agitation, or using laser burn off.

3 Claims, 7 Drawing Sheets

(56) References Cited

U.S. PATENT DOCUMENTS

| | | | |
|---|---|---|---|
| 3,773,704 A * | 11/1973 | Hall et al. | 524/448 |
| 3,790,744 A * | 2/1974 | Bowen | 219/121.69 |
| 3,847,786 A * | 11/1974 | Landauer et al. | 204/623 |
| 4,129,207 A * | 12/1978 | Cupp | 198/445 |
| 4,293,624 A * | 10/1981 | Buckley | 430/5 |
| 4,369,873 A * | 1/1983 | Heuft | 198/367 |
| 4,448,636 A * | 5/1984 | Baber | 438/670 |
| 4,481,049 A * | 11/1984 | Reichmanis et al. | 438/725 |
| 4,859,298 A * | 8/1989 | Senge et al. | 205/705 |
| 4,985,116 A * | 1/1991 | Mettler et al. | 438/674 |
| 4,986,888 A * | 1/1991 | Hosten et al. | 204/198 |
| 5,092,447 A * | 3/1992 | Wyman | 198/374 |
| 5,114,494 A * | 5/1992 | Remec | 134/1 |
| 5,195,627 A * | 3/1993 | Wyman | 198/374 |
| 5,211,826 A * | 5/1993 | Hosten et al. | 204/198 |
| 5,221,426 A * | 6/1993 | Tessier et al. | 216/65 |
| 5,318,877 A * | 6/1994 | Ober et al. | 430/270.1 |
| 5,368,902 A * | 11/1994 | Todd et al. | 427/601 |
| 5,411,897 A * | 5/1995 | Harvey et al. | 438/16 |
| 5,534,094 A * | 7/1996 | Arjavalingam et al. | 156/155 |
| 5,592,958 A * | 1/1997 | Gardner | 134/122 R |
| 5,950,643 A * | 9/1999 | Miyazaki et al. | 134/25.4 |
| 6,040,094 A * | 3/2000 | Otsuka et al. | 430/5 |
| 6,084,204 A * | 7/2000 | Han | 219/121.67 |
| 6,153,064 A * | 11/2000 | Condra et al. | 204/198 |
| 6,309,517 B1 * | 10/2001 | Condra et al. | 204/198 |
| 6,413,700 B1 * | 7/2002 | Hallman et al. | 430/302 |
| 6,439,712 B1 * | 8/2002 | Mizutani et al. | 347/102 |
| 6,530,385 B2 * | 3/2003 | Meuris et al. | 134/25.4 |
| 6,754,551 B1 * | 6/2004 | Zohar et al. | 700/121 |
| 6,758,647 B2 * | 7/2004 | Kaji et al. | 414/217 |
| 6,849,308 B1 * | 2/2005 | Speakman et al. | 427/595 |
| 7,052,124 B2 * | 5/2006 | Pickup | 347/102 |
| 7,108,003 B2 * | 9/2006 | Kitahara | 134/184 |
| 7,114,802 B2 * | 10/2006 | Kiguchi et al. | 347/101 |
| 7,122,398 B1 * | 10/2006 | Pichler | 438/66 |
| 7,156,515 B2 * | 1/2007 | Iwata | 347/102 |
| 7,208,046 B1 * | 4/2007 | Anderson et al. | 118/320 |
| 7,323,634 B2 * | 1/2008 | Speakman | 136/256 |
| 7,410,882 B2 * | 8/2008 | Wong et al. | 438/455 |
| 7,449,089 B2 * | 11/2008 | Hubel | 204/198 |
| 7,451,699 B2 * | 11/2008 | Zohar et al. | 101/483 |
| 7,531,470 B2 * | 5/2009 | Brody | 438/800 |
| 7,553,375 B2 * | 6/2009 | Sekiya | 118/62 |
| 7,632,621 B2 * | 12/2009 | Anzures et al. | 430/270.1 |
| 7,671,620 B2 * | 3/2010 | Manz | 324/761.01 |
| 7,677,195 B2 * | 3/2010 | Lee et al. | 118/323 |
| RE41,989 E * | 12/2010 | Brody | 438/800 |
| 7,846,823 B2 * | 12/2010 | Funakoshi | 438/542 |
| 7,874,636 B2 * | 1/2011 | Perrin et al. | 347/28 |
| 7,943,018 B2 * | 5/2011 | Grasa | 204/198 |
| 7,943,291 B2 * | 5/2011 | Tokunaga et al. | 430/564 |
| 7,960,206 B2 * | 6/2011 | Young et al. | 438/98 |
| 8,016,537 B2 * | 9/2011 | Watanabe et al. | 414/217 |
| 8,035,027 B2 * | 10/2011 | Moslehi | 136/251 |
| 8,062,693 B2 * | 11/2011 | Cousins | 427/58 |
| 8,119,020 B2 * | 2/2012 | Ito et al. | 216/58 |
| 8,211,617 B2 * | 7/2012 | Chang et al. | 430/270.1 |
| 8,225,741 B2 * | 7/2012 | Dixon et al. | 118/428 |
| 8,300,205 B2 * | 10/2012 | Moon | 349/187 |
| 8,309,502 B2 * | 11/2012 | Quillen et al. | 510/175 |
| 8,324,015 B2 * | 12/2012 | Harley et al. | 438/98 |
| 8,506,709 B2 * | 8/2013 | Ryabova | 118/612 |
| 2001/0039251 A1 * | 11/2001 | Sachdev et al. | 510/177 |
| 2005/0022862 A1 * | 2/2005 | Cudzinovic et al. | 136/256 |
| 2005/0118436 A1 * | 6/2005 | Bhangale et al. | 428/457 |
| 2005/0247340 A1 * | 11/2005 | Zeira | 136/263 |
| 2007/0128007 A1 * | 6/2007 | Bonora et al. | 414/217 |
| 2007/0256923 A1 * | 11/2007 | Schneider | 204/192.1 |
| 2008/0264477 A1 | 10/2008 | Moslehi | |
| 2009/0077805 A1 * | 3/2009 | Bachrach et al. | 29/890.033 |
| 2009/0137771 A1 | 5/2009 | Moriyama et al. | |
| 2009/0202727 A1 * | 8/2009 | Abas et al. | 427/284 |
| 2009/0202745 A1 * | 8/2009 | Pavani et al. | 427/595 |
| 2009/0277749 A1 * | 11/2009 | Spangler et al. | 198/464.1 |
| 2010/0047954 A1 * | 2/2010 | Su et al. | 438/61 |
| 2010/0050935 A1 * | 3/2010 | Roussillon et al. | 118/58 |
| 2010/0075234 A1 * | 3/2010 | Cousins | 430/5 |
| 2010/0184244 A1 * | 7/2010 | Hunt | 438/57 |
| 2010/0215460 A1 * | 8/2010 | Watanabe et al. | 414/217 |
| 2011/0073177 A1 * | 3/2011 | Osawa et al. | 136/256 |
| 2011/0281439 A1 * | 11/2011 | Ruatta et al. | 438/758 |
| 2011/0285976 A1 * | 11/2011 | Roset et al. | 355/30 |
| 2012/0202324 A1 * | 8/2012 | Tateishi et al. | 438/158 |
| 2013/0126300 A1 * | 5/2013 | Wolkerstorfer et al. | 198/370.09 |

OTHER PUBLICATIONS

Smith, D., "Review of Back Contact Silicon Solar Cells for Low-cost Application," Sandia National Laboratories, Albuquerque, NM, Aug. 1999, 11 pages.

Mulligan, W.P. et al., "Manufacture of Solar Cells with 21% Efficiency," SunPower Corporation, Proceedings of the 19th European Photovoltaic Solar Energy Conference (EU PVSEC '04), Jun. 2004, 5 pages.

International Search Report and Written Opinion for PCT Application No. PCT/US2011/067438 dated Mar. 11, 2013.

* cited by examiner

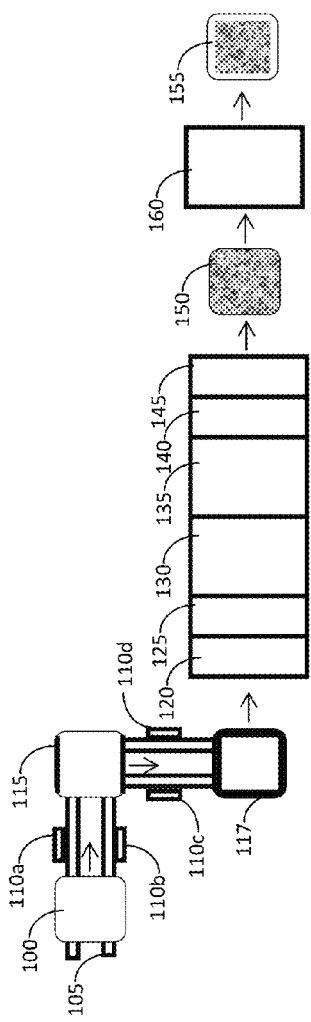
*Figure 1*
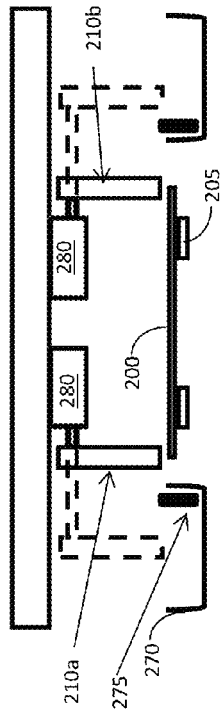
*Figure 2*
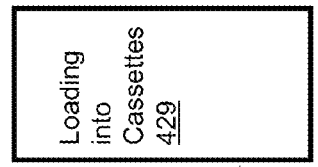
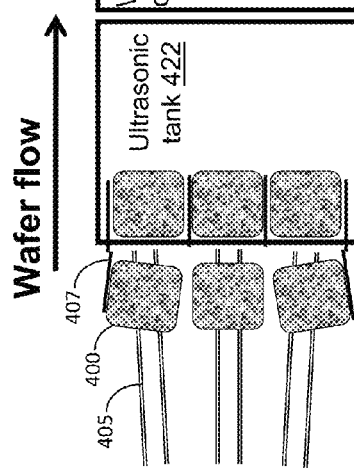
*Figure 4*

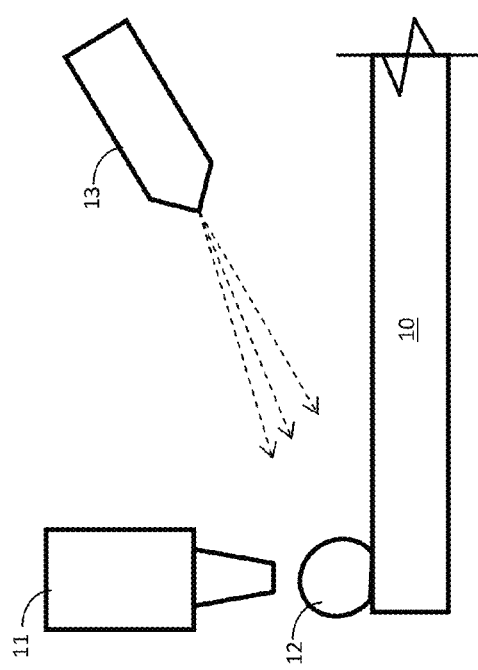
*Figure 10A*
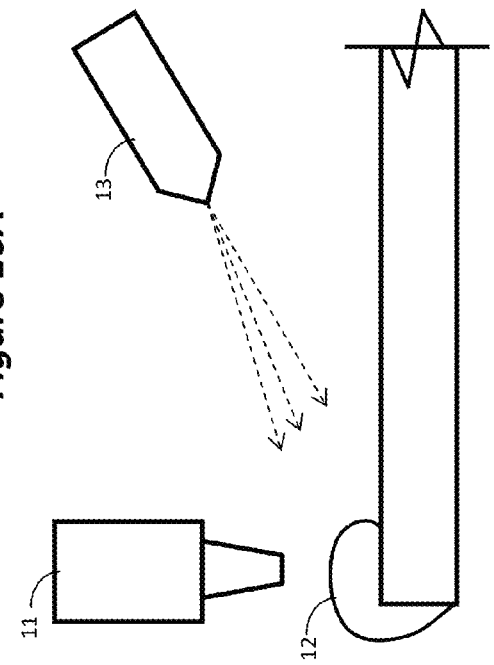
*Figure 10B*
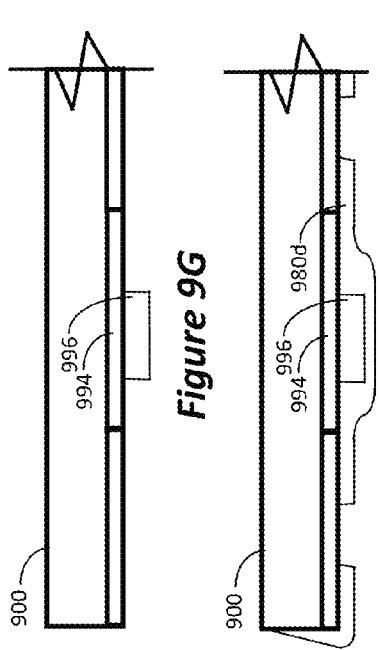
*Figure 9G*
*Figure 9H*
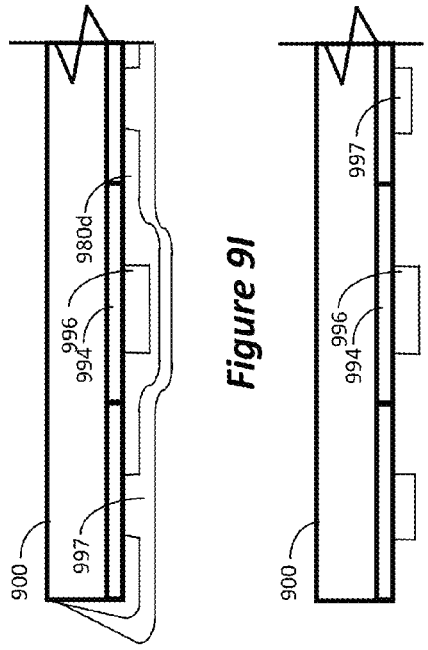
*Figure 9I*
*Figure 9J*

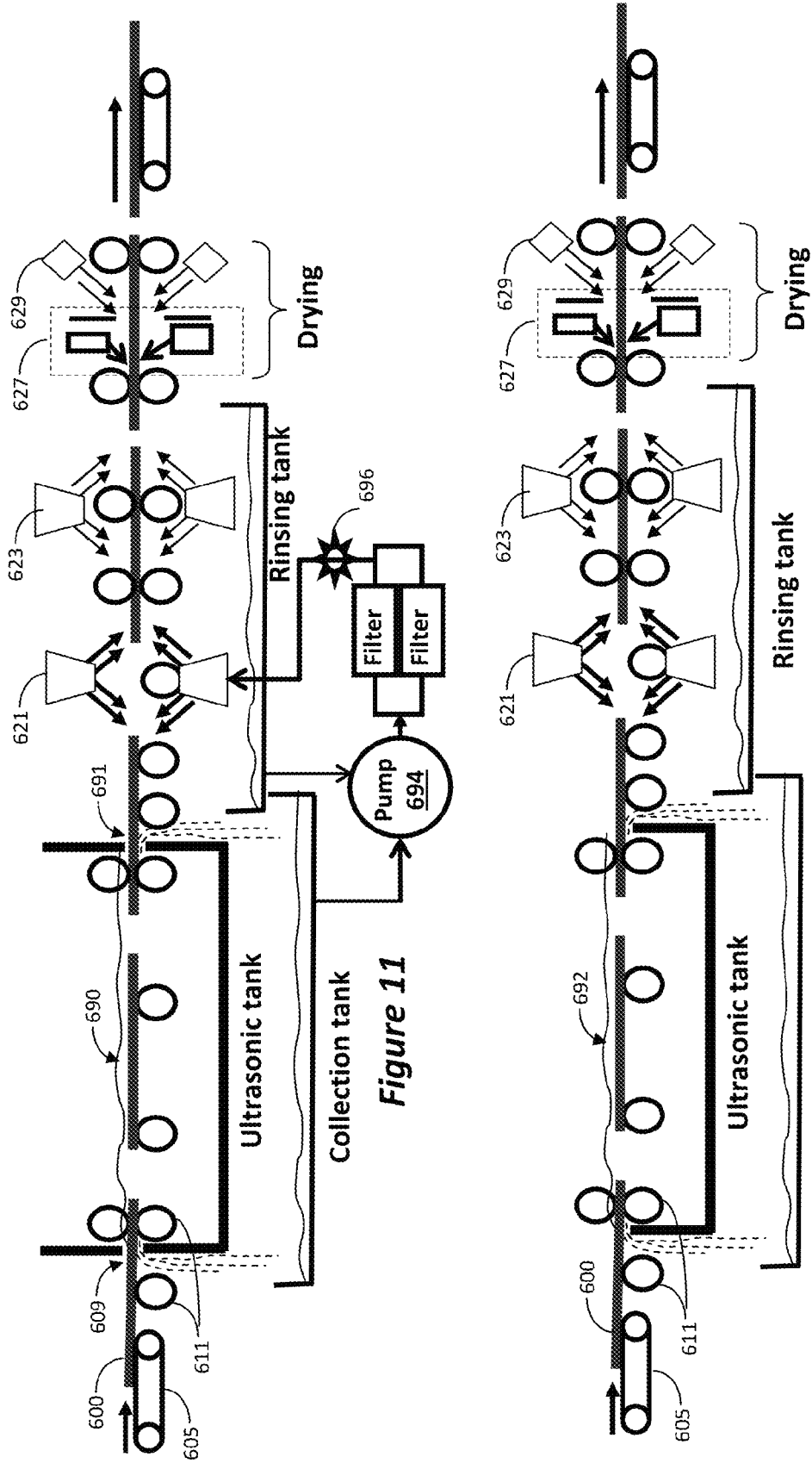

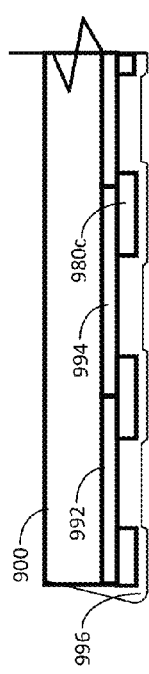
*Figure 14A*
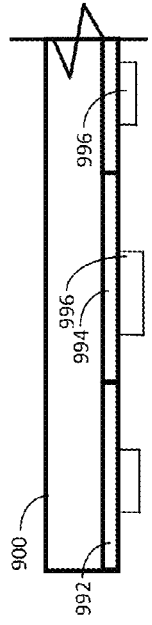
*Figure 14B*
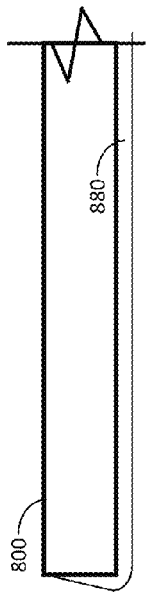
*Figure 13A*
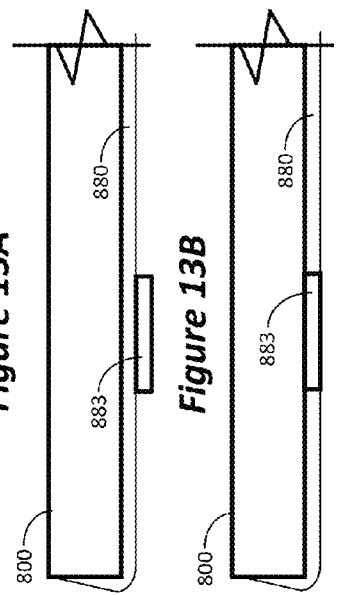
*Figure 13B*
*Figure 13C*
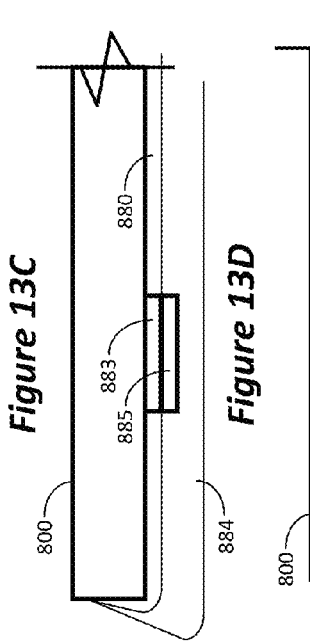
*Figure 13D*
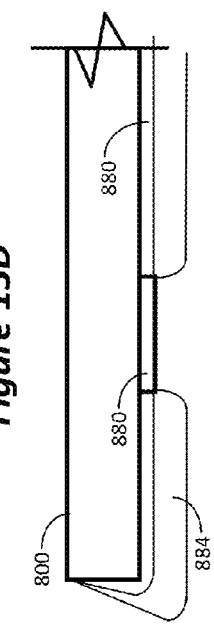
*Figure 13E*

METHOD AND APPARATUS FOR MASKING SOLAR CELL SUBSTRATES FOR DEPOSITION

RELATED CASES

This application claims priority benefit from U.S. Provisional Application Ser. No. 61/428,174, filed Dec. 29, 2010; U.S. Provisional Application Ser. No. 61/487,679, filed May 18, 2011; and U.S. Provisional Application Ser. No. 61/493,948, filed Jun. 6, 2011, the disclosures of all of which are incorporated herein by reference in its entirety.

BACKGROUND

1. Field

This disclosure relates to semiconductor fabrication, such as, fabrication of solar cells, and, more specifically, to masking and unmasking of substrates during deposition process.

2. Related Art

During a deposition process, e.g., physical vapor deposition (PVD), chemical vapor deposition (CVD), etc., different materials, such as metals, dielectrics, etc., are deposited on the substrate surface. Often, some areas on the substrate need to remain free of deposition. These areas may include, but not limited to, substrate edges, lines, or various size zones within the substrate.

The standard way to create those open areas is by either removing deposited material from those areas after deposition is done, or masking the areas during deposition. Masking is usually done by either a removable hard mask placed on the top of the substrate, or patterning photoresist using photolithography process. In the first case, the openings in the mask are the areas where deposition will occur. In the latter case, the photoresist will be removed in a downstream process by a lift-off process along with the material deposited on top of it.

The standard procedure and materials for the lift-off process are positive and negative photoresists, photoimagable polyimide and silicone. None of these materials can withstand elevated PVD or CVD process temperatures, and each requires post-process removal by wet chemicals that may be incompatible with the deposited material. Besides, these materials require a relatively long curing cycle that limits the tool throughput.

In the fabrication of solar cells, various layers are deposited on both sides of the substrate. Consequently, materials from the layers of the front surface may make conductive contact with materials from the back surface, leading to a short—referred to in the solar industry as edge shunt. Various methods have been used in the art to avoid the edge shunt, including using physical mask during deposition, using laser ablation, chemical etching of the edges, etc. Laser is sometimes used for edge shunt isolation by burning a thin line on the front of the cell along the edge through the transparent conductive and passivation layers. The area between this line and the edge is lost to electricity generation, which reduces the cell efficiency. Using laser on the back side of the cell, where the metal is, has other problems. To evaporate the metal the laser beam should be so strong that it damages the underlying silicon. Besides, melted metal gets deeply into silicon and reduces isolation resistance. Moreover, the evaporated metal gets re-deposited, contaminating the wafer.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments address the above issues by using a masking material that can withstand a high temperature environment and that is water soluble. In some examples, the material can be, but not limited to, solder masking paste or solder masking fluid. The masking material can be applied by dispensing devices, jet printers, screen or stencil printers, or by other means. After the deposition process, the masking material with everything deposited on top of it is removed by a washing step in a water tank, with or without agitation, e.g., ultrasonic, megasonic, etc.

According to another embodiment, after the deposition process, the masking material remains on the substrate, and only material deposited on top of the mask is removed. This removal would be possible due to poor adhesion and non-uniform deposition of the deposited material on the masking material. Due to poor adhesion, the deposited material flakes off of the masking material under even normal conditions, while it stays intact in the areas not covered by the mask. In this case, the removal may be a washing process in a water tank with or without agitation, which can be ultrasonic or another type, or by air or CO2 jet directed to the removal area, or another way to physically remove weakly adhered material off of the substrate.

According to another embodiment, the masking material is UV curable. This allows very short cure time, enabling high equipment throughput.

Application of the suggested approaches may be, but not limited to, masking off solar cell edges (generally referred to in the art as solar edge shunt isolation) during metal, ITO and other materials deposition, to eliminate a need for laser oblation, chemical or plasma etching that is normally used to remove conductive material off the solar cell edge. Another application is substrate patterning before depositing a dielectric on the substrate, which with the following metal deposition step would create interlayer contacts.

Other aspects and features would be apparent from the detailed description, which is made with reference to the following drawings. It should be appreciated that the detailed description and the drawings provides various non-limiting examples of various embodiments of the invention, which is defined by the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 schematically illustrates a system and process for masking solar cells for edge shunt isolation.

FIG. 2 is a schematic illustration of a printer head arrangement according to one embodiment.

FIG. 3 is a schematic illustration of a printer station arrangement according to one embodiment.

FIG. 4 schematically illustrates the lifting station according to one embodiment.

FIGS. 9A-9J illustrate an example of an embodiment for fabricating interdigitated back contact solar cell.

FIGS. 10A and 10B schematically illustrate an apparatus and method for inkjet printing a mask over the brim of the wafer, according to one embodiment.

FIGS. 11 and 12 provide embodiments that allow conveying the substrates through the wet process areas, including complete submerging them into liquid, without deflecting them from the travel plane and inducing bending stress.

FIGS. 13A-13E illustrate another embodiment for fabricating metal contacts on the backside of a solar cell, according to one embodiment.

FIGS. 14A-14B illustrate yet another embodiment for fabricating metal contacts on the backside of a solar cell, according to one embodiment.

DESCRIPTION

Figure 5:
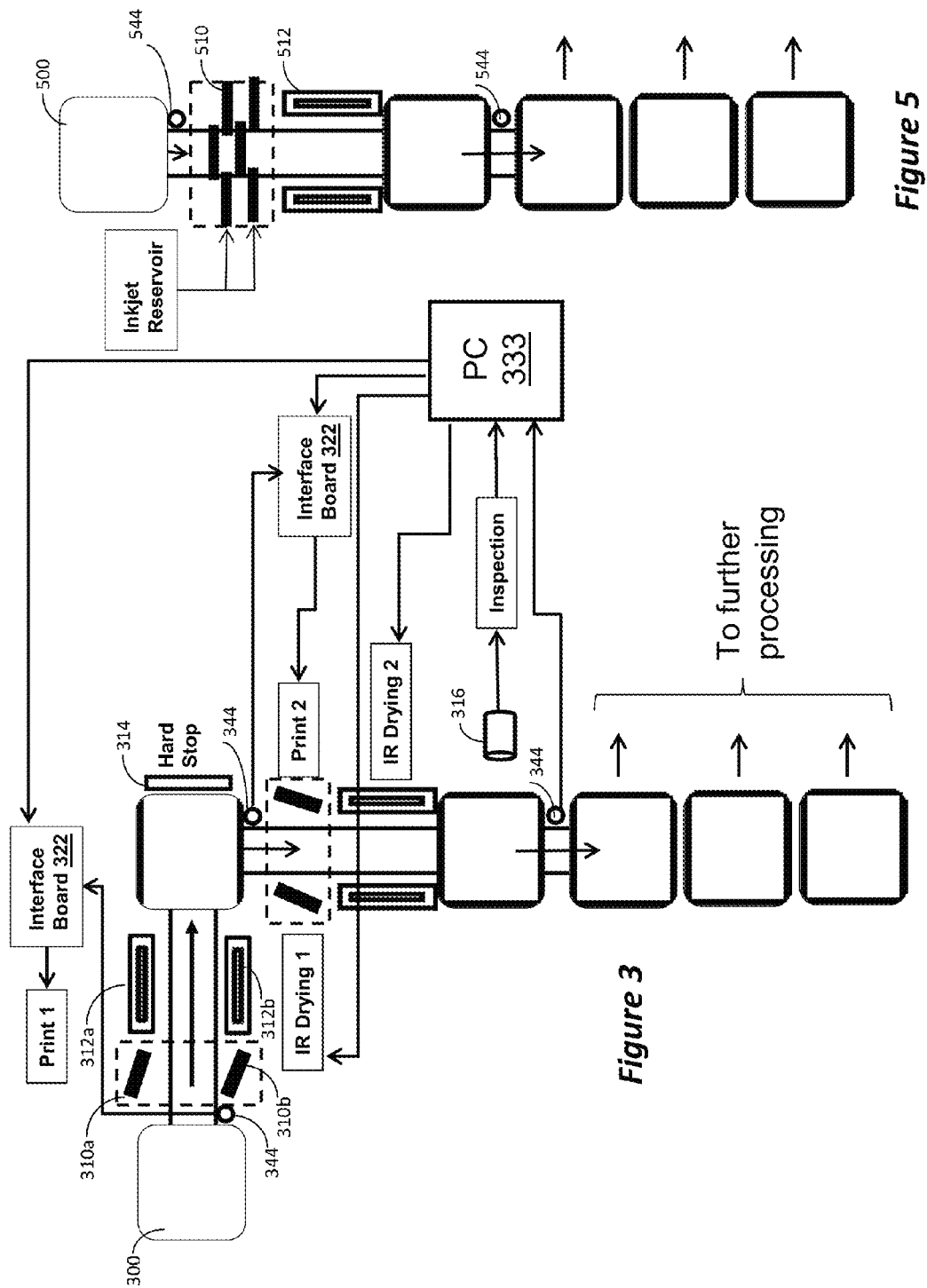
FIG. 5 schematically illustrates another example of a printing station according to another embodiment.

Various embodiments enable masking of substrates for deposition, and subsequent lifting of the mask with deposited material. The embodiments largely utilize masking materials that can be used in high temperatures and vacuum environment. That is, the material should have minimal outgassing once inside a vacuum chamber and withstand the temperatures during deposition process, i.e., the materials will not carbonize, will not permanently cure, and will not damage or poison films it comes in contact with. While water soluble masking fluid is desirable, other solvent based can be used, such as IPA (isopropyl acetate) soluble material. The material may also be UV curable.

Various embodiments can be employed to obtain certain desirable results. The embodiments will be described below with reference to various examples, especially with respect to production of solar cells. Various embodiments may be used in conjunction with different layers of a solar cell, and the formulation of the masking material may need to be tailored to that specific layer. For example, some surfaces are hydrophobic while other are hydrophilic. Thus, the masking material needs to be tailored such that, when applied, is would cover only the designated area of the substrate.

It may also be that the mask needs to be made of two or more different materials applied sequentially. For example, the first layer may be formulated to adequately adhere to a surface that may be hydrophobic or hydrophilic, while the second layer may be formulated to provide good masking and removal characteristics.

EXAMPLE I

This example provides embodiment for edge shunt isolation. In the solar cell fabrication process, various layers are serially deposited on both surfaces of a silicon wafer. Since the sputtered material tends to also coat the edge or brim of the wafer, layers from the back and the front surfaces of the wafer meet and are in physical and electrical contact at the edges of the wafer. Consequently, the fabricated cell is shunted. The current method in the art to remove the shunt is by what's called laser edge isolation, according to which a laser beam is used to ablate at least one of the layers at the edge of the wafer. For example, for square wafers the laser can be used to "draw" a square that is about a millimeter smaller than the size of the wafer on the front or rear surface of the wafer. The drawing is done such that the layer is ablated where the line is drawn.

According to one embodiment, illustrated in FIGS. 1-4, system and methods are provided that perform shunt edge isolation without the need for laser ablation. The wafers are removed from cassettes and as they are transported on a conveyor, a mask is dispensed on in the area to be masked. The system applies a curable polymer mask material (masking fluid or solder mask) to the wafer at an atmospheric environment. Then the material is cured by heat, UV or by other means prior to going into vacuum. The printed wafer is moved into a loadlock of a vacuum solar cell fabrication tool, e.g., a PVD sputtering tool, an Ion Implant, or a CVD tool. Once the wafer has been coated and exits the tool, it is transferred to an ultrasonic water bath for mask and material removal. In case of water-soluble masking fluid no solvents or metal mask are required. If a solvent-based masking fluid was used, the ultrasonic bath may or may not contain an appropriate solvent. In the later case after the deposited material has been removed the mask is dissolved and removed in an external cleaner.

FIG. 1 schematically illustrates an overall embodiment for applying mask for edge shunt isolation. A wafer 100 is placed on a conveyor 105 moving as shown by the arrow. As the wafer 100 travels, printer heads 110a and 110b print lines 115 at the opposite edges of the wafer. The wafer then changes travel direction and passes under printer heads 110c and 110d, where two lines 117 are printed on opposite sides of the wafer, such that the entire edge of the wafer is printed.

The printer heads 110a-110d can be any of the commercially available inkjet heads. For example, a standard industrial piezoelectric-activated inkjet head can be used. Such inkjet heads normally have 256 nozzles and can be setup to provide resolution such as 100-1200 dpi. The inkjet heads can have other nozzle count dependently on the application. The printed masking fluid in this embodiment is water soluble. Commercially available solder mask or solder resist can be used in the printer heads for printing the mask. For example, aqueous liquid photoimageable solder mask (LPSM), generally made of mixture of photo initiators, photosensitizers, epoxies and acrylates, can be used.

After mask printing, the wafer enters loadlock 120. In this system, two loadlocks 120 and 125 are staggered with increased vacuum levels. A series of vacuum processing chambers, such as PVD chambers 130 and 135 deposit a layer on the entire surface of the wafer, including over the mask. Note that while here only two chambers are shown for brevity, any number of chambers can be used. To exit the vacuum system, the wafer traverses the two staggered loadlocks 140 and 145.

The wafer is then transferred to lifting station 160. In this example, the lifting system 160 includes solution bath, for example an ultrasonic or megasonic bath. In station 160 the mask is lifted, so that the material deposited over the mask is removed.

Examples of the various parts that may be used in the system shown in FIG. 1, will now be explained with reference to FIGS. 2-4. FIG. 2 is a schematic illustration of a printer head arrangement according to one embodiment. In FIG. 2, wafer 200 rides on conveyor 205. Printer heads 210a and 210b are coupled to actuators 280 and can be moved and positioned, as illustrated by the broken lines. In their most extended position, the printer heads can be positioned over troughs 270, such that any dripping will be collected by the troughs 270. Also, when the printer heads are moved to their printing position, any excess masking fluid is wiped by wipers 275.

FIG. 3 is a schematic illustration of a printer station arrangement according to one embodiment. The printing station illustrated in FIG. 3 can be used in a system such as that shown in FIG. 1, or can be implemented as a stand-alone system for mask printing prior to further processing. The various elements of the system are controlled by controller 333, which can be, e.g., a PC. Sensors 344 send position signals through interface boards 322 to controller 333, indicating the position of the wafer 300. Using these position signals, the controller 333 operates the printing stations, print 1 and print 2, and the drying stations dry 1 and dry 2. Each print station has two printing heads, e.g., inkjet printers 310a and 310b, each having 256 injectors. Each print station is followed by a dry station 312a, 312b. The dry station can include, e.g., dry air, heating lamps, infrared or UV curing, or a combination of drying/curing elements. Once the mask printing is completed and dried, a camera 316 sends an inspection signal to the controller 333.

FIG. 4 schematically illustrates the lifting station according to one embodiment. After wafers 400 have been coated in the coating system, they are delivered to the lifting station so as to remove the mask and thereby "lift" the coating material from the areas where the mask has been printed. In this example, the wafers are delivered three abreast, but other arrangements can be used. The three-abreast arrangement shown in FIG. 4 is illustrated to match the three abreast arrangement shown at the exit of the printing system shown in FIG. 3. Therefore, if a complete in-line system is desired, then the coating system should also be configured to enable three-abreast processing.

In FIG. 4, the wafers 400 are first delivered into an ultrasonic tank 422, which utilizes ultrasonic agitation and solvent, e.g., water, to remove the mask and thereby lift the deposited material from the areas where the mask was printed. Depending on the wafer's strength and the wafer inner structure, a megasonic agitation may or has to be used instead of an ultrasonic. The wafers are then delivered to a cleaning station 424 that, in this example, uses water jets to clean the wafers, followed by rinsing 426 and drying 428. If desired, the wafers may then be loaded onto cassettes in station 429.

In FIG. 4, since three wafers are delivered abreast, a feature is used to make sure they are aligned in such a way that they have a certain gap between then. As shown, each wafer 400 is delivered on an independent conveyor 405. The middle conveyor is aligned perpendicularly to the entrance of the system, i.e., parallel to the travel direction of the wafer. On the other hand, the two exterior conveyors are aligned lightly off of the direction of travel, such that the wafer is delivered to the other edge of the system. At each edge of the system, a bumper 407 catches the side of the wafer and guides the wafers back closer together to ensure the proper distance between them. If the size of the sonic tank does not require bringing the wafers closer after the side conveyors have moved them apart, the bumper 407 can align the wafer such that it is parallel to the center wafer, i.e., parallel to the direction of travel inside the system. Such a bumper arrangement can be used in any of the system described herein, whenever several wafers travel abreast at uncertain relative distance and/or angle and have to be properly positioned with a desired orientation.

FIG. 5 schematically illustrates another example of a printing station according to another embodiment. In the embodiment of FIG. 5, only one printing station is provided, which has multiple printing head 510 (here 6 are shown), each having multiple, e.g., 256, printing nozzles. In this manner, the entire mask can be printed in one pass, and then the wafer 500 is transferred to a single drying station 512. Sensors 544 can still be used to accurately sense the location of the wafer 500 at each stage. In this, as well as in the previous example, different heads may use different masking fluids.

Figure 6:
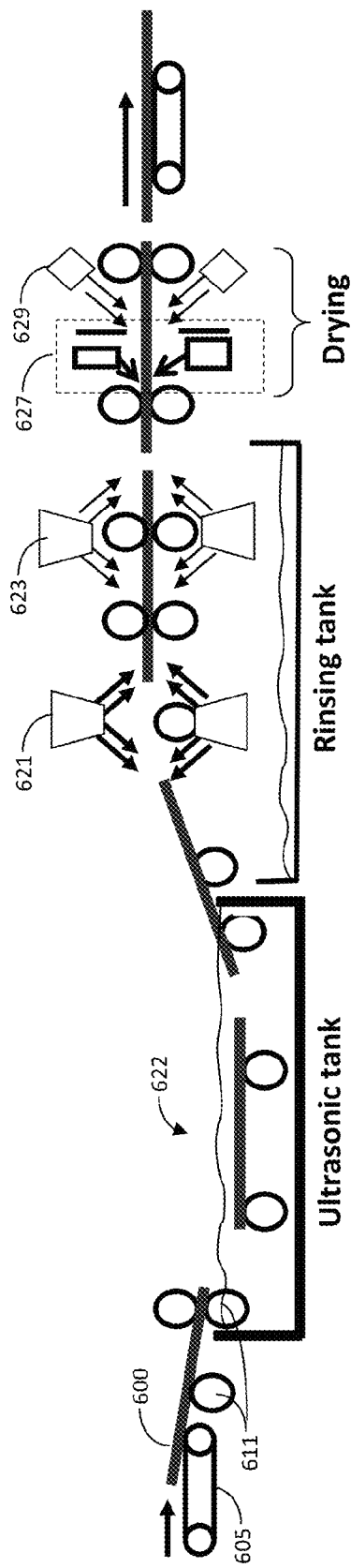
FIG. 6 schematically illustrates an example of a system for lifting deposited material according to one embodiment.

FIG. 6 schematically illustrates an example of a system for lifting deposited material according to one embodiment. Wafer 600 is transported on conveyor 605 and rollers 611 and is delivered into a solvent tank 622 which, in this example, is an ultrasonic tank with water serving as solvent. Without being bound by theory, it is believed that the ultrasonic agitation help crack the material that was deposited over the mask, potentially due to poor adhesion to the masking material. This enables the solvent to penetrate the deposited material and reach the masking material and dissolve the masking material, such that the deposited material is lifted off only at places where it was deposited over masking material.

The wafer is then transported over the rinsing tank, wherein it is first rinsed by water jets 621, followed by DI water rinse 623. Thereafter the wafer is dried using air knives 627, followed by hot air injectors 629. Thus, The wafer exits the system fully dry and can be loaded onto cassettes or be sent to any further processing necessary.

EXAMPLE II

According to another example, the same masking approach as disclosed above is used; however, a laser is used to burn off the organic masking material, setting the metal layer above it loose. Then, the loose deposited material can be simply blown off or washed away. In this example, the laser should have a wavelength in the range that silicon is transparent to. For example, silicon is transparent to infrared light with wavelengths above about 1.1 micrometres. Thus, by using a laser at, e.g., 1090 nanometer, the system is able to remove metal which is deposited over inkjet mask, without melting the metal nor damaging the underlying silicon. The latter was confirmed by photo luminescence analysis. The advantage of this method is that it does not reduce the cell area that collects the light, does not generate silicon particles, does not re-sputter removed metal, and does not damage the silicon that lies underneath the laser processed area. The laser may be used at power range of 3-10 Watt and in the range of 1064-9000 nm wavelength, e.g., 1090 nm or 2000 nm laser wavelength.

Figure 7:
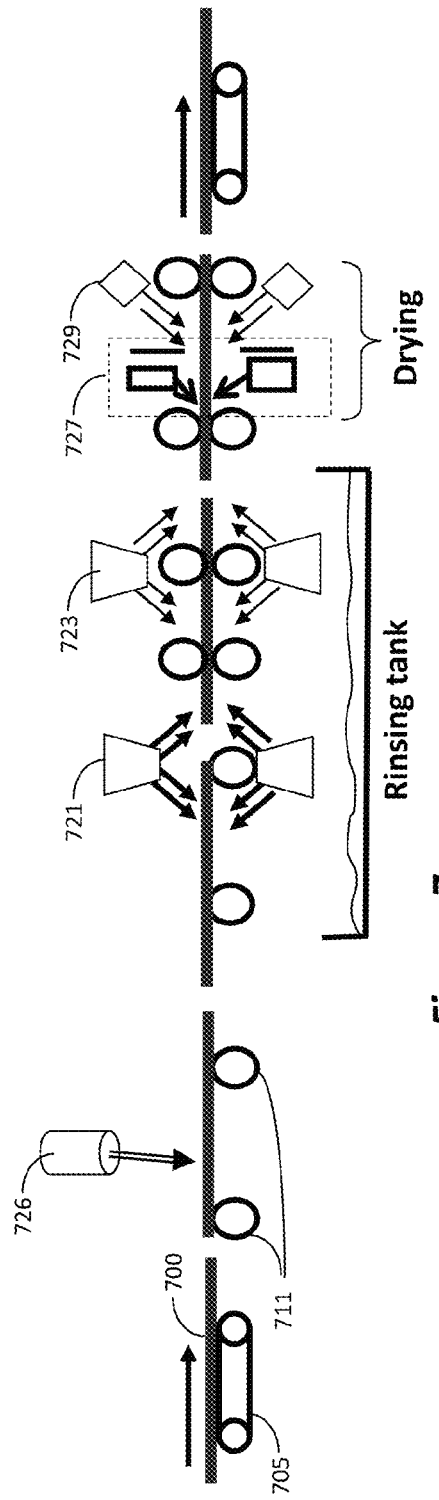
FIG. 7 schematically illustrates an example of a system for lifting deposited material using laser, according to one embodiment.

FIG. 7 schematically illustrates an example of a system for lifting deposited material using laser, according to one embodiment. Wafer 700 is transported on conveyor 705 and rollers 711 and is delivered into a laser station 726. Laser 726 is of a wavelength that is transparent to silicon, such that it can be illuminated from the silicon side to burn off the masking material without harming the silicon or melting the deposited layer, e.g., deposited metal layer. Without being bound by theory, it is believed that once the deposited mask is burned off, the deposited material is loosened and can easily break off. This enables the solvent to dissolve any remaining and now open masking material and wash off the deposited material where it was deposited over masking material.

The wafer is then transported over the rinsing tank, wherein it is first rinsed by water jets 721, followed by DI water rinse 723. Thereafter the wafer is dried using air knives 727, followed by hot air injectors 729. Thus, The wafer exits the system fully dry and can be loaded onto cassettes or be sent to any further processing necessary.

EXAMPLE III

Figure 8A:
FIGS. 8A-8E schematically illustrate a process for forming the back contact of a silicon-based solar cell, according to one embodiment.
Figure 8B:
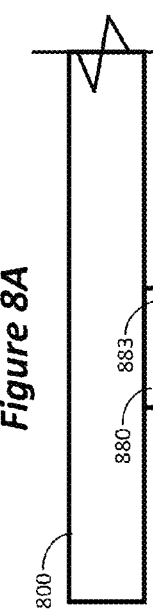
Figure 8C:
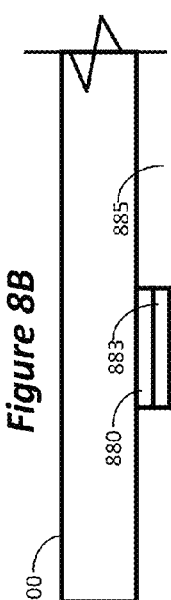
Figure 8D:
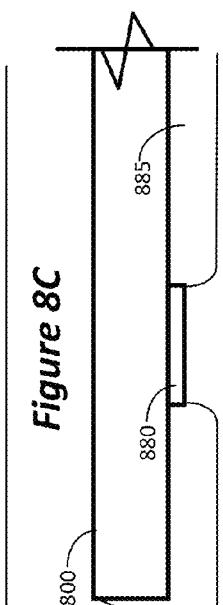
Figure 8E:
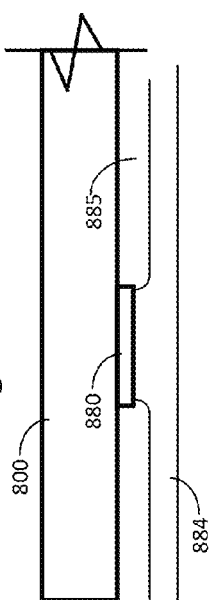

Another example is provided herein, which is particularly beneficial for fabrication of the back contact in silicon-based solar cells. FIGS. 8A-8E schematically illustrate a process for forming the back contact of a silicon-based solar cell, according to one embodiment. In FIG. 8A, contact 880 is formed on the backside of solar cell 800. Contact 880 may be made of, e.g., silver, using conventional technology, such as silk screening of silver paste, or inkjet printed with a conductive and solder able ink. In FIG. 8B, a mask 883 is inkjet printed over the silver contact 880, using the printing technique described in the above examples. Then the cell is transferred to a deposition system and an insulating layer 885, such as silicon oxide or silicon nitride, is deposited over the entire backside of the cell 800, as shown in FIG. 8C. The cell is then transferred to a lifting station, such as that described in Examples I or II above, and the mask 883 is removed, together with the insulating layer material 885 that was deposited over the mask 883. The resulting structure is illustrated in FIG. 8D. Then, an aluminum layer 884 is deposited over the entire backside of the cell 800, as shown in FIG. 8E.

EXAMPLE IV

Figure 9A:
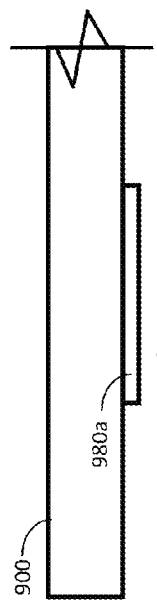
Figure 9B:
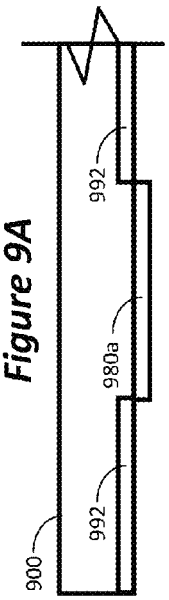

FIGS. 9A-9J illustrate an example of an embodiment for fabricating interdigitated back contact solar cell. Such a solar cell is advantageous in that it has no metal contacts on the front surface thereof, thus having larger surface for collecting sunlight. In FIG. 9A, a mask 980a is formed on the backside of the solar cell 900. The mask is inkjet printed using any of the methods described above. Then, the backside of the wafer is doped, e.g., n-type, using any conventional method, such as diffusion, ion implant, etc., thus creating doped regions 992, as shown in FIG. 9B.

Figure 9C:
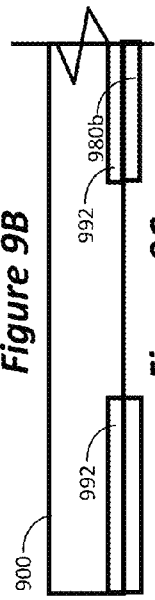

In FIG. 9C mask 980a has been removed using any of the lifting methods described above, and mask 980b is inkjet to cover the areas doped in the previous step. In order to properly align mask 980b, according to one embodiment during printing of mask 980a, fiduciary elements are printed in addition to the removable mask 980a. The fiduciary elements are printed using masking fluid that is not soluble during the removal of mask 980a. Thus, when mask 980a is removed, mask 980b can be aligned using the fiduciary elements. The fiduciary elements can be left on the call, since they are printed on the backside and do not interfere with sunlight collection. Of course, if desired, the fiduciary elements can be removed after printing of mask 980b using the proper solvent.

Figure 9D:
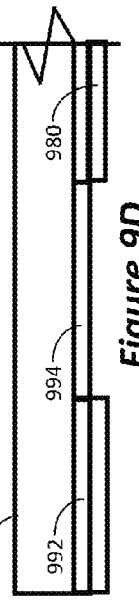
Figure 9E:
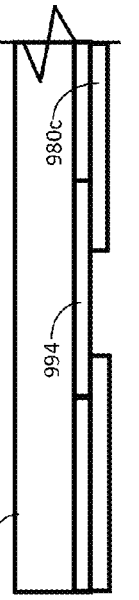
Figure 9F:
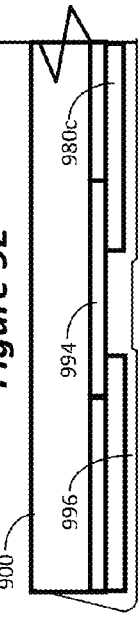

The backside is then doped using the opposite polarity, e.g., p-type, as shown by doping area 994 in FIG. 9D. Mask layer 980b is then removed using any of the above described methods, and mask 980c is inkjet on the backside to delineate a contact on one of the doping areas, in FIG. 9E a contact is delineated over the p-type doping 994. Then a metallic contact layer 996 is deposited over the backside, as shown in FIG. 9F. The metallic layer is then lifted with the mask, using one of the methods and apparatus as explained above, thus leaving contact 996, as shown in FIG. 9G. Mask 980d is then inkjet over the backside to delineate contacts on the other doped areas, as shown in FIG. 9H. A second metallization layer, 997, is then formed over the backside, as shown in FIG. 9I. Finally, the second metallization layer 997 is lifted with the mask 980d using any of the above methods, thus creating the contacts 997.

EXAMPLE V

As shown in. e.g., FIGS. 8C and 8E, when depositing material over a surface of the wafer, some of the material is also deposited over the edge or brim of the wafer. This leads to what was referred to in Example I as edge shunt. Accordingly, it is desirable to avoid deposition over the edge of the substrate. Therefore, as exemplified in FIG. 9H, it is desirable to have the mask over the edge or brim of the wafer so that when the mask is removed, the deposited material is also removed from the edge of the wafer. However, since the mask is printed using inkjet, the printing is done of the surface of the wafer and not on the edge, i.e., it cannot cover the brim of the wafer, while during deposition the deposited material generally does cover the brim of the wafer.

FIGS. 10A and 10B schematically illustrate an apparatus and method for inkjet printing a mask over the brim of the wafer, according to one embodiment. In FIG. 10A, masking material 12 is inkjet on wafer 10 from inkjet head 11. Air injector 13 is then used to blow air onto the masking fluid 12, so that it is pushed over the side of the wafer's surface and onto the brim, as shown in FIG. 10B. Thereafter the wafer is transported to the drying station, so that the mask is dried as deposited on both the surface and on the brim of the wafer, so that any deposition over the brim can be removed when removing the mask. Any masking fluid droplets that may go onto the opposite side of the wafer would be removed during the mask removal step.

EXAMPLE VI

When removing the mask using ultrasonic or megasonic agitation, it is desirable to have the entire wafer submerge in the solvent. In the embodiment of FIG. 6, the wafer was delivered into the ultrasonic tank at a descending angle and was removed from the tank at an ascending angle. Such an operation imparts undesirable stress on the wafer and leads to breakage. An example of such transport arrangement is disclosed in U.S. Pat. No. 6,971,505 issued in 2005 to Rena Sondermaschinen. This is done mostly in order to submerge substrate in a vessel containing liquid, such as, e.g., water, wet etchant, etc. The vessel is generally an open top vessel and the wafers have to be lowered into the vessel from the top. During these steps, the substrates incur extra stress due to bending while changing travel direction in the plane away from the substrate surface.

FIGS. 11 and 12 provide embodiments that allow conveying the substrates through the wet process areas, including complete submerging them into liquid, without deflecting them from the travel plane and inducing bending stress. This allows for processing thinner and more fragile substrates, while increasing throughput and reducing substrate breakage.

In order to maintain the constant plane for moving substrates and avoid bending stress, insertion and extraction of the substrates into and out of the liquid process vessel is done through narrow, e.g., 1-3 mm wide, slots, extended across the entire substrate pass. Liquid is pumped into the vessel so that the liquid level is maintained slightly above the top edge of the slot, and a certain amount is constantly leaking through the slot. In one example, the tank is an ultrasonic cleaning tank, so that the liquid used is water. In this example, water flowing out of the slots is collected into a tank and then pumped through the filters back into the process vessel, or used for other purposes, such as rinsing operation. By properly setting the flow to correspond to the loss of liquid through the slots, the water level above the slot is mostly self-regulating. According to one example the liquid level is self-regulating by setting the flow in the range of between 3 and 20 GPM for a system having narrow 1-3 mm wide slots. With the higher flow, the level in the vessel would rise increasing static pressure, which would increase the flow through the slots, which would result in lowering the level back to the equilibrium. The water level 2-5 mm above the slot creates so little pressure that the resulting flow does not impose additional stress to the wafers.

FIG. 11 illustrates an example of such a system. As shown, wafer 600 is delivered on conveyor 605 and is picked up by rollers 611. The rollers insert the wafer 600 into the ultrasonic tank 690 via slot 609. The wafer level in the tank is maintained so that it is above the level of the slot 609 and, consequently, continuously leaks from slot 609. However, since the wafers are inserted via slot 609, they are submerged upon insertion. The rollers then transport the wafers through the tank and exit them via slot 691, which is at the same level as slot 609. A collection tank is provided to collect the liquid that leaks through the slots 609 and 691.

Also, in the embodiment of FIG. 6, the overflow collected by the collection tank is pumped by pump 694, filtered, and then used for the rinse heads 621. Optionally, the filtered water can be heated by heater 696 prior to injecting them for rinsing. Such an arrangement can be used in any of the embodiments disclosed herein, including those of FIGS. 6, 7, 11 and 12.

In FIG. 12, rather than having a slot, the ultrasonic tank is simply continuously overflowing, such that the liquid level is always higher than the rim of the tank and always overflows over the rim of the tank. The wafers are inserted as close as possible to the rim of the tank, so that they are submerged upon insertion. The remaining of the system can be the same as that of FIG. 6 or FIG. 11.

EXAMPLE VII

FIGS. 13A-13E illustrate another embodiment for fabricating metal contacts on the backside of a solar cell, according to one embodiment. In FIG. 13A, dielectric layer 880 is formed on the backside of solar cell 800. Then, in FIG. 13B, metallization material 883 is deposited over the dielectric 880. metallization material 883 may be, for example, silver paste mixed with glass frit which is silk-screen over the dielectric layer 880. In FIG. 13C, the solar cell has been annealed at high temperature, such that the metallization material fused through the dielectric layer 880, so as to make contact with the backside of solar cell 800. This step is well known and is done conventionally in the art. In FIG. 13D, mask 885 is deposited over the fused contact 883, using any of the methods described above. Also, metallization layer 884, e.g., aluminum layer, is deposited over the entire backside of the solar cell. In FIG. 13E, the mask 885 is lifter together with the part of metallization layer 884 that has been deposited above the mask 885. This is done using any of the lifting techniques disclosed above. Consequently, clear access is provided to fused contact 883 for easy soldering, while metallization layer 884 makes electrical contact with fused contact 883.

EXAMPLE VIII

FIGS. 14A-14B illustrate yet another embodiment for fabricating metal contacts on the backside of a solar cell, according to one embodiment. This embodiment is generally similar to that described in Example IV, except that the final contacts over the n-type and p-type layers 992 and 994 are fabricated together. In FIG. 14A, mask 980c is fabricated so as to have openings over the p-type and n-type doping areas. Then conductive layer 996, e.g., aluminum layer, is deposited over the entire backside of the solar cell 900. In FIG. 14B the mask have been lifted off together with parts of the metallization layer 996 that was deposited over the mask, such that contacts 996 remain over both the n-type and p-type doped areas 992 and 994.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system for fabrication of solar cells, comprising:
   a conveyor for transporting the solar cells;
   a plurality of inkjet heads positioned over the conveyor, said inkjet heads configured to print a removable mask over selected areas of the solar cells;
   an inkjet reservoir to provide masking material to the inkjet heads;
   a drying station positioned downstream of said plurality of inkjet heads to dry said removable mask;
   position sensors sensing motion of the solar cells and sending position signals;
   a controller configured to receive the position signals from the position sensors and operating said plurality of inkjet heads and said drying station
   a mask lifting station configured for removing the removable mask, wherein said mask lifting station comprises an ultrasonic tank or a megasonic tank, three entry conveyors arranged abreast and configured to deliver three solar cells abreast into said mask lifting station, and wherein a middle entry conveyor is aligned perpendicularly to an entry side of said mask lifting station, while two external conveyors are aligned obliquely to said entry side of said mask lifting station, such that no two of the entry conveyors are parallel to each other.

2. The system of claim 1, wherein said mask lifting station further comprises a bumper configured to align the solar cells such that the solar cells in the external conveyors travel parallel to the solar cell delivered by the middle entry conveyor.

3. The system of claim 1, wherein said mask lifting station further comprises a bumper at each edge of said mask lifting station, each bumper configured to catch the side of the solar cells delivered by the external conveyors and guide the solar cells back closer together to ensure the desired orientation between the solar cells.

* * * * *